United States Patent [19]

Albarello et al.

[11] Patent Number: 4,492,936

[45] Date of Patent: Jan. 8, 1985

[54] FRACTIONAL-DIVISION FREQUENCY SYNTHESIZER FOR DIGITAL ANGLE-MODULATION

[75] Inventors: Alain Albarello; André Roullet; Alberto Pimentel, all of Paris, France

[73] Assignee: Thomson-CSF, Paris, France

[21] Appl. No.: 408,874

[22] Filed: Aug. 17, 1982

[30] Foreign Application Priority Data

Aug. 17, 1981 [FR] France ................ 81 15808

[51] Int. Cl.³ ................ H03C 3/06; H04B 1/04
[52] U.S. Cl. ................ 332/19; 328/14;
332/16 R; 375/62; 375/67; 455/112; 455/113
[58] Field of Search ........... 328/14; 332/16 R, 19;
375/44, 45, 46, 47, 48, 49, 50, 51, 52, 53, 54, 55,
56, 57, 62, 63, 64, 65, 66, 67; 455/42, 43, 112, 113

[56] References Cited

U.S. PATENT DOCUMENTS

| | | | |
|---|---|---|---|
| 4,068,199 | 1/1978 | Madoff | 332/19 |
| 4,308,508 | 12/1981 | Sommer et al. | 455/112 X |
| 4,320,361 | 3/1982 | Kikkert | 332/19 X |
| 4,328,554 | 5/1982 | Mantione | 328/14 X |

FOREIGN PATENT DOCUMENTS 2454219 7/1980 France .
1560233 1/1980 United Kingdom .

OTHER PUBLICATIONS

Electronic Components & Applications, vol. 3, No. 1, Nov. 1980, by: P. R. Brennand et al., "Frequency Synthesiser Using LSI Devices", pp. 47-61.
Patent Abstracts of Japan, vol. 5, No. 109, Jul. 15, 1981, pp. E-65, 781.

Primary Examiner—Eugene R. LaRoche
Assistant Examiner—W. R. Paxman
Attorney, Agent, or Firm—Oblon, Fisher, Spivak, McClelland & Maier

[57] ABSTRACT

In order to deliver an angle-modulated output signal as a function of digital information, the frequency synthesizer delivers an output frequency $F_S=(N+k)F_R$, where N is the integral part of a number $N+k$ and $F_R$ is a reference frequency. Provision is made for a variable oscillator, an oscillator control loop comprising in series a variable divider having a preselected divisor N, a phase comparator for receiving the reference frequency and a summing device. The synthesizer further comprises a phase accumulator for performing, at the frequency $F_R$, modulo-M summation of a number $G=k(M)$ applied to its input. The sum and carry outputs of the accumulator are coupled respectively to the summing device in order to deliver a signal for compensating the signal delivered by the phase comparator and to the divider for delivering a control signal to select the divisor $N+1$. An adder having one output coupled to the input of the phase accumulator receives a constant number g on one input and a number dg which is representative of the digital information on another input.

4 Claims, 1 Drawing Figure

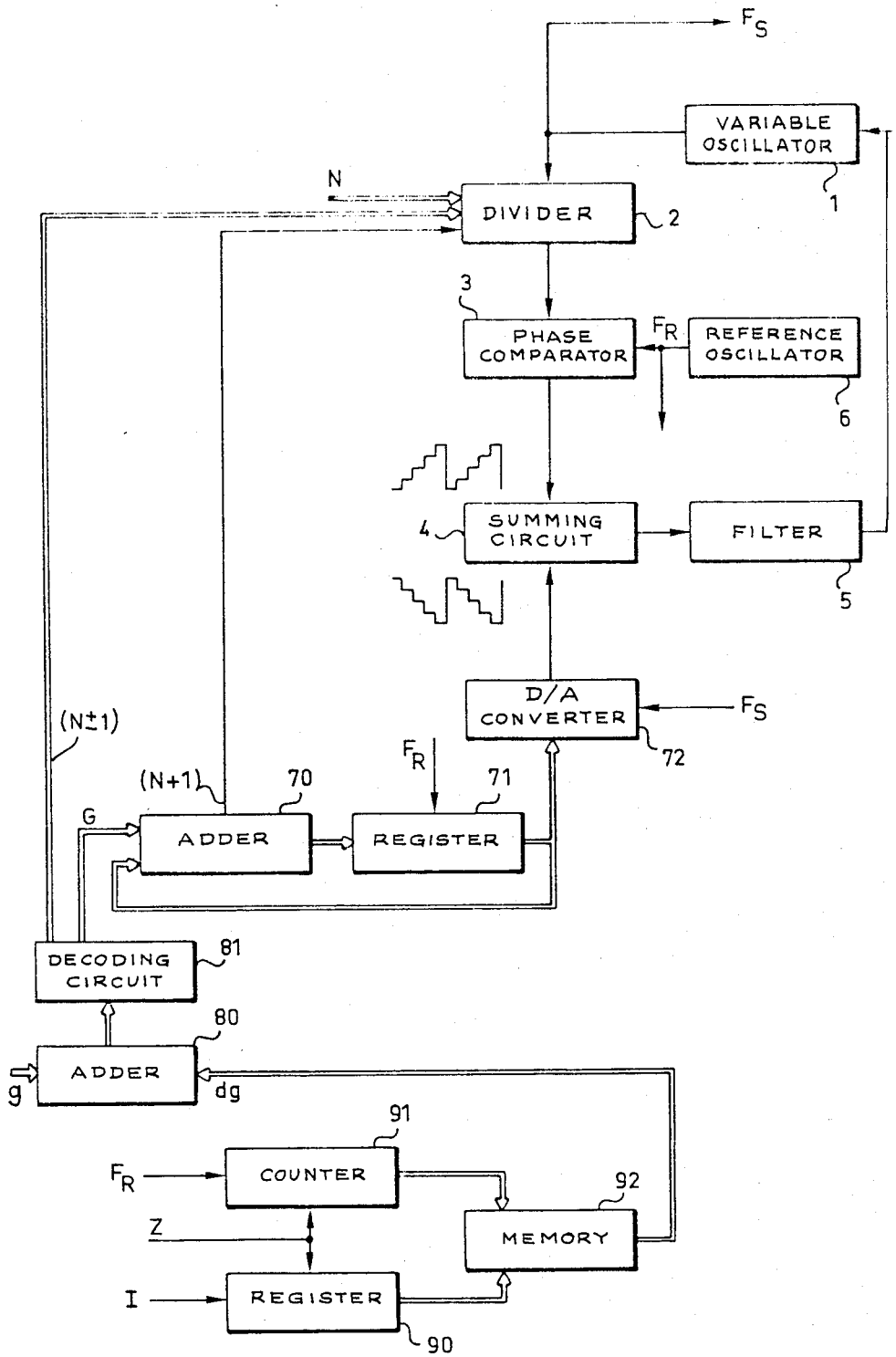

FRACTIONAL-DIVISION FREQUENCY SYNTHESIZER FOR DIGITAL ANGLE-MODULATION

BACKGROUND OF THE INVENTION

1. Field of the Invention:

This invention relates to a fractional-division frequency synthesizer for obtaining an angle-modulation signal.

2. Description of the Prior Art:

A frequency synthesizer of the fractional-division type is already well-known and has the intended function of delivering an output signal of the form $F_S=(N+k)F_R$ where N is the integral part of a number $N+k$ and $F_R$ is the frequency of a reference signal. This synthesizer comprises a variable oscillator and an oscillator control loop which in turn comprises in series a variable divider having a preselected divisor, a comparator for comparing the phase of the output signal of the divider with the phase of the reference signal, a summing device and a filter. The synthesizer further comprises a phase accumulator which performs modulo-M summation of the number $G=k(M)$ at the frequency $F_R$, the sum and carry outputs of said accumulator being coupled respectively to the summing device in order to deliver a compensation signal and to the divider in order to deliver a control signal to select the divisor $N+1$.

When a frequency synthesizer of this type is intended to be associated with a digital-signal modulator for delivering a signal which is angle-modulated by digital data, it is a known practice to place the modulator in the control loop or at the output of the frequency synthesizer. When the modulator is placed in the control loop between the summing device and the control input of the variable oscillator, the control loop behaves as a high-pass filter for the modulation signals which are applied to the control input of the variable oscillator and there is no possibility of transmitting the low-frequency components of the digital information. Another way of eliminating the loop passband problem consists in providing a fixed-frequency angle modulator by means of a voltage-controlled quartz oscillator, the signal delivered by the latter being added to the signal of the frequency synthesizer by means of mixing followed by filtering in order to remove the undesirable mixing products. This method is costly, however, one of the main reasons being that it is solely of the analog type. It proves necessary in each case to place an analog filter at the input of the modulator in order to limit the spectrum of the modulated signal.

SUMMARY OF THE INVENTION

The object of the present invention is to circumvent all or part of the disadvantages mentioned in the foregoing by proposing a fractional-division frequency synthesizer in which a digital angle-modulator is incorporated in order to permit transmission of low-frequency digital data and even the continuum.

This is obtained by producing action on the input signal of the phase modulator in order to carry out the modulation.

According to the invention there is provided a fractional-division frequency synthesizer for delivering an output signal of the form $F_S=(N+k)F_R$, where N is the integral part of a number $N+k$ and $F_R$ is the frequency of a reference signal, wherein said synthesizer comprises a reference oscillator for delivering the reference signal, a variable oscillator having one control input and one output, and a control loop for said variable oscillator. Said control loop comprises in series a variable divider having one signal input coupled to the output of the variable oscillator and one control input for selecting the divisor $N+1$, said divider having a preselected divisor N a comparator for comparing the phase of the output signal of the divider with the phase of the reference signal, a summing device having a first input coupled to the comparator and a second input, and a filter having one output coupled to the control input of the variable oscillator. The synthesizer further comprises means in which a main output is provided for delivering a number $G=k(M)$, being a positive whole number, and a phase accumulator which receives the reference signal and the signal G in order to perform modulo-M summation of the number G at the frequency $F_R$, the sum and carry outputs of said accumulator being coupled respectively to the second input of the summing device and to the control to select the divisor $N+1$ of the variable divider. In order that the signal $F_S$ should be an angle-modulation signal modulated by a digital item of information, a distinctive feature lies in the fact that the aforesaid means comprise an adder having one output coupled to the main output, a first access for receiving a constant number g and a second access for receiving a number dg which is representative of the digital information.

BRIEF DESCRIPTION OF THE DRAWINGS

Other features of the invention will be more apparent to those skilled in the art upon consideration of the following description and accompanying FIGURE which represents a frequency synthesizer according to the invention.

DETAILED DESCRIPTION OF THE PREFERRED EMBODIMENT

For the sake of enhanced simplicity, it will be stated in the following description and appended claims that a circuit either receives or delivers a number. As will readily be understood, this is intended to mean that the circuit receives or delivers one or a plurality of signals which are representative of this number.

The accompanying FIGURE illustrates a frequency synthesizer of the fractional division type comprising a certain number of circuits in addition to a conventional fractional-division frequency synthesizer. By conventional synthesizer is meant a synthesizer which is intended to deliver an output signal having a given frequency and selected by means of values indicated at the inputs of said synthesizer. In the following description, the portion of the synthesizer shown in the FIGURE and designated as a "conventional fractional-division frequency synthesizer" will be described first and the principles governing the operation of a synthesizer of this type will be recalled at the same time.

The FIGURE represents a variable oscillator 1, the output of which delivers the output signal at the frequency $F_S$ of the frequency synthesizer. The output of the variable oscillator 1 is connected to the signal input of A variable divider 2 in which the selection of the divisor N is represented in the FIGURE by an arrow which is pointed at the divider and designated by the letter N.

The output signal of the divider 2 is applied to one of the two comparison inputs of a phase comparator 3 which receives on its other input the output signal at the frequency $F_R=480$ kHz of a reference oscillator 6. The output signal just mentioned is obtained from a high-precision quartz oscillator.

The output signal of the phase comparator 3 is applied to one of the two inputs of an analog summing circuit 4, the other input of which receives the signal generated by a phase accumulator followed by a digital-to-analog converter 72. The phase accumulator is constituted by a digital adder 70 and by a buffer register 71. The adder 70 receives on a first input a signal representing a number G which will be specified hereinafter. The output of the adder 70 is connected to the signal input of the buffer register 71, the control signal of which is the signal at the frequency $F_R$ of the oscillator 6. The adder 70 is a modulo-M adder, where M is a whole number (M=480 in the case of the example described). The adder 70 has a carry output which indicates overstepping of the maximum count (M−1=479). This output is designated by the reference (N+1) and is connected to an input for modifying the value of the divisor of the divider 2. The output of the buffer register 71 is connected on the one hand to a second input of the adder 70 and on the other hand to one input of the digital-to-analog converter 72 which receives the signal $F_S$ on another input provided with a frequency divider. As mentioned earlier, the output signal of the converter is received by the summing circuit 4.

The output of the summing circuit 4 is connected to the input of a loop filter 5, the output of which delivers the control signal for the variable oscillator.

The section of the frequency synthesizer which has been described thus far or, in other words, the portion consisting of the units 1 to 6 and 70 to 72, constitutes a conventional frequency synthesizer of the fractional division type. The principle of operation of this synthesizer will now be recalled below.

The frequency $F_S$ to be obtained at the output of the variable oscillator 1 is of the form $$F_S=(N+k)F_R$$

where (N+k) is a number whose integral part is N and whose fractional part is k. Since the frequency $F_S$ is not equal to N times the reference frequency $F_R$, the comparison by the phase comparator 3 of the signal at the frequency $F_S/N$ given by the variable-rank divider with the signal at the frequency $F_R$ produces a signal which is representative of their phase difference and progressively increases (or decreases according to the value of k) by a constant value at each period $T_R=1/F_R$, at least as long as the divisor of the divider 2 is equal to N.

The number G is applied to the first input of the adder 70 such that $G=k(M)$ where, as mentioned earlier, k is the decimal part of (N+k) and M is the modulo of the adder 70. Modulo-M addition performed by the adder 70 at the rate $F_R$ of control of the register 71 increases the count of the adder 70 by the value G at each period $T_R$. Each time the maximum capacity of the adder is attained or exceeded, the adder delivers a carry bit at its carry output (N+1) and, during the time interval $T_R$ of the carry bit, the divisor of the variable divider 2 is increased by one unit and therefore changes to N+1. Thus the phase comparator which compared the phase of the signal $F_S/N$ with the phase of the signal $F_R$ produced, as already mentioned, an output signal which was representative of the progressively increasing (or decreasing) phase difference. The phase difference is reduced to zero by the transitions to N+1 of the divisor over a time interval equal to $M(T_R)$. In consequence, a stair-step sawtooth signal is produced at the output of the phase comparator 3. In the case of each frequency $F_S$, the signal produced by the phase comparator 3 assumes a series of discrete values which are dependent one $k=G/M$ and in which the theoretical numerical value at each instant is contained in the phase accumulator 70, 71 or subject to a factor of proportionality. One example of an output signal of the comparator 3 is given in the FIGURE. The output signal of the comparator 3 is summated with the compensation signal delivered by the digital-to-analog converter 72. The compensation signal is opposite with respect to the output signal of the comparator 3 when the frequency $F_S$ is locked to the frequency $F_R$. In order to ensure compensation throughout the entire range of frequency variation of the frequency synthesizer, the fact that the amplitude of the signal which is representative of the phase difference (at the output of the phase comparator 3) is inversely proportional to the frequency $F_S$ is taken into account. To this end, the compensation signal is made proportional not only to the contents of the phase accumulator but also to the period $1/F_S$ of the signal of the frequency synthesizer and is obtained from the output signal of the buffer register and from the signal $F_S$ by means of a digital-to-analog converter 72.

The output signal of the digital-to-analog converter 72 is added in the summing device 4 to the output signal of the phase comparator 3. The signal delivered by the summing circuit 4 is filtered by the loop filter 5 so as to serve as a control signal for the variable oscillator 1.

The portion of FIGURE which has just been described corresponds to a fractional-division frequency synthesizer of a conventional type. The frequency synthesizer which has served as a model for this description is intended to deliver an output frequency within the range of 51.4 to 109.4 MHz per step P of 1 kHz ($P=F_R/M=1$ kHz) and by means of values of N within the range of 107 to 227.

In a conventional fractional-division frequency synthesizer, the number G is a constant number in respect of a given value $F_S$ of the output signal. In the case of the frequency synthesizer according to the invention, the number G is derived from the sum of a number g and of a number dg, said sum being formed by an adder 80. The number g is constant while the number dg is on the contrary a positive or negative variable number which is representative of a digital item of information I to be transmitted by modulation.

In the case of the example herein described, the number dg is representative of a digital datum I having a bit rate of 16 kilobits per second corresponding to bits having a time-duration of 62.5 μS. This information is applied to the input of a five-stage register 90 having a series input and parallel outputs, said outputs being connected to a first group of five addressing inputs of a read-only memory 92 (ROM).

The reference signal at the frequency $F_R$ is applied to the signal input of a modulo-n counter 91 (n=30). Said counter delivers to a second group of five addressing inputs of the read-only memory (ROM) 92 a number whose value varies from 0 to 29 during a time interval equal to the time interval of one information bit since the reference frequency $F_R$ and the modulo of the counter 91 have been chosen so as to ensure that one complete counting cycle has a time-duration of 62.5 μS ($30T_R=30/480,000=62.5$ μS). The display signals received by the read-only memory 92 are thus on the one hand the representation of the last five information bits I received and on the other hand the flags for sampling thirty information-bit samples having a time-duration $T_R$. The configuration of the last five information bits and the sample number received at a given instant by the read-only memory 92 correspond to one eight-bit word stored in this memory. Said eight-bit word is the number dg delivered to the adder 80. In view of the fact that g corresponds to a given frequency $F_S$ at the output of the variable oscillator if dg is continuously zero, then said value dg can be considered as a frequency increment. Said frequency increment is sent to the phase accumulator 70-71 and the output signal of the fractional-division frequency synthesizer becomes $F_S+(dg/M)F_R$. In other words, $F_S$ undergoes a phase variation during the time $T_R$ of one sample which is equal to $2\pi(dg/M)(F_R)T_R=2\pi(dg/M)$.

Values dg are stored in the memory 92 as a function of the sample number and are such that, in the case of one information bit, the sum of the phase variations resulting from each sample corresponds to a predetermined phase variation of the signal $F_S$ during the information bit.

The thirty stored values dg corresponding to the thirty samples relating to each configuration of five consecutive bits are representative of a predetermined phase-modulation for each configuration. The thirty-two predetermined phase modulations corresponding to the thirty-two configurations of five bits are obtained by simulation with a computer as a function of the type of modulation to be obtained and by taking into account the response time of the control loop of the frequency synthesizer in order to optimize the spectrum of the modulated signal $F_S$. This offers the advantage on the one hand of dispensing with the need for the analog filter which would have been necessary at the input of a conventional angle modulator for limiting the spectrum of the modulated signal and on the other hand of performing a spectrum optimization treatment which is not readily applicable to conventional modulating devices.

As will be readily apparent, in order to ensure that the modulation takes place in a given direction, the phase-positioning time of the frequency-synthesizer loop must be distinctly shorter than the time of one information bit I in respect of the increments dg. In the embodiment considered by way of example, the positioning time of the loop is of the order of one-fifth of the time of one bit.

It should be noted that the register 90 and the counter 91 are provided with a reset input which is energized at the beginning of each fresh data transmission by a reset signal Z.

It is worthy of note that the phase accumulator 70-71 followed by the converter 72 is capable of producing a compensation signal only if G is higher than zero and lower than the modulo M of the adder 70 since the compensation signal is obtained from the circuits 70, 71 which produce an output signal having a direction for the control loop only if their input signal G is greater than zero and smaller than the modulo of the adder 70. For this reason, the adder 80 is followed by a decoding circuit 81 which, when g+dg is smaller than 0 (or in other words when dg is negative and higher than g at absolute value), delivers a signal $G=M+g+dg$ to the adder 70 and reduces by one unit the divisor of the variable divider 2. When g+dg is higher than M, the decoding circuit 81 delivers a signal $G=g+dg-M$ to the adder 70 and increases the divisor of the variable divider 2 by one unit. The outputs of the decoding circuit 81 which serve to reduce or increase the divisor of the variable divider 2 by one unit are designated in the FIGURE by the reference (N+1).

The present invention is not limited to the example described in the foregoing. From this it follows that sampling of the digital information signal I by means of the counter 91 can be dispensed with but there is no longer any possibility of inexpensive optimization of the spectrum of the signal transmitted by modulation. In order to achieve optimization of the spectrum, it accordingly proves necessary to utilize narrow-band filters placed outside the control loop and adapted to receive the output signal of the variable oscillator 1. This solution is usually impracticable in the event that one filter is intended to correspond to each output frequency $F_S$.

It is also possible to modify the modulable frequency synthesizer in accordance with the FIGURE so as to enable it to process digital information I having a bit rate other than 16 k.bits/second. In this case, the modulo of the counter 91 which determines the number of samples per information bit must be controlled as a function of the rate of information bits I received so as to ensure that there is a whole number of samples having a time-duration $T_R$ during a one-bit time interval. To this end, it is necessary in the first place to ensure that the value of the reference frequency $F_R$ in cycles per second (hertz) is divisible by the value in bits per second of the information flow-rate so that the quotient of the division gives the modulo of the counter 91 and in the second place to provide a switching device for modifying the modulo of the counter 91 as a function of the flow rate of the numerical information received.

Instead of being performed at the frequency $F_R$, the sample operation may be carried out at a frequency $F'_R$ which is a submultiple of $F_R$ and all the remarks made in the previous paragraph remain applicable in this case by replacing $F_R$ by $F'_R$. However, the use of a sampling frequency which is a submultiple of $F_R$ makes it necessary to define the predetermined phase modulation with a smaller number of samples and therefore with a lower degree of accuracy.

In the event that the information flow-rate is not an exact submultiple of the reference frequency but is slightly different, it is possible to re-synchronize the bit rate with $F_R$. This operation, however, has the effect of periodically introducing jitter in the time-duration of the information bit I which is equal to the time-duration of one sample and this must be taken into account in the operation of the counter 91 by increasing or decreasing the modulo n of said counter by one unit.

Different simplifications can be made in the FIGURE in the event that the characteristics of the modulation to be performed and of the information to be modulated are simplified with respect to those which have already been considered in the foregoing description with reference to the FIGURE. From this it accordingly follows that, in addition to suppression of sampling mentioned earlier and corresponding to suppression of the counter 91, it is also possible to dispense with the register 90 and the memory 92 in the event that the information I can be directly utilized as a signal for modulating the number g, or in other words in the event that the modulation of g is on the all-or-none principle, with $dg=I$.

Similarly, in the event that $g+dg$ is always positive and lower than the modulo M of the adder 70, the decoding circuit 81 no longer serves any useful purpose, the output of the adder 80 delivers the signal G directly to the adder 70 and the connection (N±1) to the variable divider 2 is no longer necessary.

In certain alternative embodiments, the modulating digital information dg applied to the input of the adder 80 can be obtained from analog information of the speech type, for example. Should the information originally appear in analog form, sampling and analog-to-digital conversion circuits will permit conversion to digital form so as to constitute the modulating information dg.

What is claimed is:

1. A fractional-divisional frequency synthesizer for delivering an output signal of the form $F_S=(N+k) F_R$, where N is the integral part and k is the fractional part of the number $N+k$ and $F_R$ is the frequency of a reference signal, wherein said synthesizer comprises:
   a reference oscillator for delivering the reference signal;
   a variable oscillator having a control input and an output, said output providing said output signal $F_S$;
   a variable-oscillator control loop comprising in series a variable divider having one signal input coupled to the output of the variable oscillator and one control input to select the divisor $N+1$, said divider having a preselected divisor N, a comparator for comparing the phase of the output signal of the divider with the phase of the reference signal, a summing device having a first input coupled to the output of the comparator and a second input, and a filter coupled between the output of the summing device and the control input of the variable oscillator, means having a main output for delivering a number $G=k$ (M), M being a positive whole number; and
   a phase accumulator for receiving the reference signal and the signal G in order to perform modulo-M summation of the number G at the frequency $F_R$, said phase accumulator having sum and carry outputs respectively coupled to the second input of the summing device and to the control input to select the divisor $N+1$ of the variable divider and wherein, in order to angle modulate the synthesizer output signal $F_S$ by digital information, the means comprises an adder, said adder having an output coupled to the main output and a first adder input for receiving a constant number g and a second input for receiving a number dg which is representative of the digital information.

2. A frequency synthesizer according to claim 1, wherein the adder is coupled to the main output via a decoding circuit, said decoding circuit having one output which constitutes the main output and an auxiliary output which is coupled to the variable divider, said decoding circuit being intended to compare the value $g+dg$ with the values M and zero, and in the case in which $g+dg$ is lower in value than zero, to deliver the number G in the form $G=M+g+dg$ at the main output and a control signal for reducing the divisor of the variable divider by one unit at the auxiliary output or else, in the case in which $g+dg$ is higher in value than M, to deliver the number G in the form $G=g+dg-M$ at the main output and a control signal for increasing the divisor of the variable divider by one unit at the auxiliary output.

3. A frequency synthesizer according to claim 1, wherein the means comprise: a series-parallel register for receiving the modulation information, said register being provided with outputs; and a memory programmed according to the modulation system being used, said memory being provided with address inputs coupled to the outputs of the register and being coupled to the second adder input in order to deliver the number dg to said adder.

4. A frequency synthesizer according to claim 3 wherein, in order to ensure that the digital information is sampled in a positive whole number n samples per bit, on the one hand the value of frequency $F_R$ in hertz is chosen so as to be equal to n times the value in bits per second of the flow of digital information and, on the other hand, the means comprise a modulo-n counter having a counting input for receiving the reference signal, and having outputs, and the memory is provided with additional addressing inputs coupled to the outputs of the counter and separate from the addressing inputs which are coupled to the outputs of the register.

* * * * *